United States Patent
Izawa

(10) Patent No.: US 6,214,725 B1
(45) Date of Patent: Apr. 10, 2001

(54) ETCHING METHOD

(75) Inventor: Mitsutaka Izawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/212,637

(22) Filed: Dec. 16, 1998

(30) Foreign Application Priority Data

Dec. 19, 1997 (JP) ............................................ 9-350826

(51) Int. Cl.$^7$ .................................................. H01L 21/44
(52) U.S. Cl. ........................ 438/656; 438/685; 438/706
(58) Field of Search .................................. 438/656, 305, 438/396, 706, 714, 680, 683, 685, 723, 743, 749

(56) References Cited

U.S. PATENT DOCUMENTS

| | | | |
|---|---|---|---|
| 5,411,631 | 5/1995 | Hori et al. | |
| 5,817,562 | * 10/1998 | Chang et al. | 438/305 |
| 5,976,986 | * 11/1999 | Naeem et al. | 438/714 |
| 5,990,007 | * 11/1999 | Kajita et al. | 438/680 |
| 5,994,232 | * 11/1999 | Clampitt | 438/706 |
| 6,054,360 | * 4/2000 | Watanabe | 438/396 |

FOREIGN PATENT DOCUMENTS

| | | |
|---|---|---|
| 3-288430 | 12/1991 | (JP) . |
| 9-251984 | 9/1997 | (JP) . |

OTHER PUBLICATIONS

Metal Stack Etching Using a Helical Resonator Plasma (Received Dec. 7, 1995: accepted Apr. 19, 1996).

\* cited by examiner

*Primary Examiner*—David Nelms
*Assistant Examiner*—Phuc T. Dang

(57) ABSTRACT

An etching method can restrict side etching (corrosion) of an AlCu film as an upper layer upon etching of a TiN film as a lower layer. The etching method is characterized by, upon etching of a stacked film of AlCu film/TiN film with taking an oxide film as a mask, as a gas for performing etching of TiN film on a lower layer, a compound gas containing a chlorine atom is used, and using a mixture gas of the etching gas and an additive gas and not using a $Cl_2$, a corrosion resistance of AlCu film against the etching gas can be improved.

12 Claims, 6 Drawing Sheets

ETCHING METHOD

BACKGROUND OF THE INVENTION

1. Field of the Invention

The present invention relates to a method for performing an etching of a stacked layer of AlCu film/TiN film with taking an oxide layer as a mask.

2. Description of Related Art

Conventionally, in order to etch a stacked layer of AlCU film/TiN film, a photo resist (PR) mask is used. At this time, a selection ratio of PR/AlCu is as small as about 1.5 to 2.

In the recent years, associated with down-sizing of wiring, a height (layer thickness) of the PR is becoming lower (thinner) in order to maintain a resolution. On the other hand, when a step is present in a device, large amount of over etching has been required in order to eliminate residual of etching due to presence of the step, facetting of the AlCu film due to etching out of the PR can be caused. Therefore, low selection ratio of PR/AlCu can be a critical factor upon etching of AlCu film toward the future. Therefore, an oxide layer mask achieving the selection ratio of PR/AlCu as high as about 5 to 10 becomes essential.

The conventional etching method of the AlCu film is illustrated in FIGS. 2(A) to 2(E). As shown in FIG. 2(A), a TiN film 2, an AlCu film 3 and a TiN film 4 are deposited on a $SiO_2$ film 1 as an interlayer insulation layer by way of sputtering, in a sequential order, and then, an $SiO_2$ film is deposited on the TiN film 4.

Then, as shown in FIG. 2(B), a resist film 6 is formed on the $SiO_2$ film 5. The resist film 6 is patterned to form a mask for etching the lower $SiO_2$ film 5.

Subsequently, as shown in FIG. 2(C), the resist film 6 is removed. Here, with taking the $SiO_2$ film as the mask, wiring is formed.

Discussing more particularly, at first, at a first step, etching of the AlCu film 3 is performed. Here, etching is performed by using $Cl_2/BCl_3/N_2/CHF_3$. For example, using a condition of gas flow rates of $Cl_2/BCl_3/N_2/CHF_3$=20 sccm/40 sccm/5 sccm/5 sccm, a pressure of 25 Pa, RF power of 650 W, etching of the AlCu film 3 is performed with forming a side wall protection film by supplying an N type deposition material to the side wall of the AlCu film 3 to form an electrode wiring 7 (FIG. 2(D)).

Next, at a second step, etching of the $TiN_2$ film 2 is performed. At the second step, similarly to the foregoing first step, etching is performed using $Cl_2/BCl_3/N_2/CHF_3$. For example, using a condition of gas flow rates of $Cl_2/BCl_3/N_2/CHF_3$=5 sccm/40 sccm/5 sccm/5 sccm, a pressure of 25 Pa, RF power of 450 W, etching and overetching of the TiN layer 2 is performed to complete the electrode wiring 7 (FIG. 2(E)).

However, the prior art illustrated in FIGS. 2(A) to 2(E) encounters a problem to cause side etching (corrosion) of the AlCu film 3 during etching of the TiN film 2 at the second step.

The reason is as follow. Namely, in case of the mask using resist film, no carbon type deposition material is supplied from the resist film. In etching of AlCu/TiN, etching is progressed with taking Cl radical as main etchant. On the other hand, in order to obtain perpendicular shape at the side wall, it is preferred to progress etching with forming a side wall protection film on the side wall of the AlCu film 3. IN case of the mask of the resist film, since the side wall protection layer can be formed on the side wall of the AlCu film 3 by supplying carbon from the resist, etching can be performed without causing corrosion of the AlCu film.

In contrast to this, in case of the oxide film mask, since the protective layer can be formed by an additive gas upon etching the AlCu film 3. However, upon etching of the TiN film 2, the effect of the additive gas becomes small to make wise wall protecting effect of the AlCu film 3 small in comparison with that in the case where the resist film is used as the mask primarily for no carbon being supplied. Therefore, reaction between the excessive Cl radical and the AlCu film is progressed to cause isotropic etching of the side wall of the AlCu film for causing corrosion.

SUMMARY OF THE INVENTION

Therefore, an object of the present invention is to provide an etching method which can restrict occurrence of side etching (corrosion) of AlCu film upon etching of a TiN film.

In order to accomplish the above, according to the first aspect of the present invention, an etching method for performing etching of a stacked film of AlCu film/TiN film with taking an oxide film as a mask, is characterized in that as a gas for performing etching of TiN film on a lower layer, a compound gas containing a chlorine atom is used, and using a mixture gas of the etching gas and an additive gas and not using a $Cl_2$, a corrosion resistance of AlCu film against the etching gas can be improved.

Preferably, $BCl_3$ is used as the etching gas and $N_2$ and $CHF_3$ are used as the additive gas.

In the alternative, $CHCl_3$ or $HCl$ is used as the etching gas.

According to the second aspect of the present invention, a method for forming a stacked film electrode wiring in a semiconductor device comprises the steps of:

forming a first film formed with a first alloy;

depositing a second film of a second alloy over the first alloy film;

depositing a third film of the first alloy over the second film;

depositing an oxide film over the third film;

depositing a resist film over the oxide film;

patterning the resist film;

etching the oxide film with taking the patterned resist film;

etching the second and third films with removing the resist film and taking the oxide film as a mask by a first etching gas containing a source of a material of a side wall protection film to be deposited on a side wall of the second film; and etching the first film by a second etching gas generating a controlled amount of an etchant sufficient for effecting etching for the first film with avoiding corrosion of the second film.

According to the third aspect of the present invention, a method for forming a stacked film electrode wiring in a semiconductor device comprises the steps of:

forming a first film formed with a first alloy serving as an insulation film, on a semiconductor substrate;

depositing a second film of a second alloy over the first alloy film, the second alloy forming the electrode wiring;

depositing a third film of the first alloy over the second film;

depositing an oxide film over the third film;

depositing a resist film over the oxide film;

patterning the resist film;

etching the oxide film with taking the patterned resist film;

etching the second and third films with removing the resist film and taking the oxide film as a mask by a first etching as containing a source of a material of a side wall protection film to be deposited on a side wall of the second film; and etching the first film by a second etching gas generating a controlled amount of an etchant sufficient for effecting etching for the first film with avoiding corrosion of the second film.

According to a fourth aspect of the present invention, a method for forming a stacked film electrode wiring in a semiconductor device comprises the steps of:

forming a first film formed with TiN;

depositing a second film of AlCu over the first alloy film;

depositing a third film of TiN over the second film;

depositing $SiO_2$ film over the third film;

depositing a resist film over the oxide film;

patterning the resist film;

etching the $SiO_2$ film with taking the patterned resist film;

etching the second and third films with removing the resist film and taking the $SiO_2$ film as a mask by a first etching gas containing a source of a material of a side wall protection film to be deposited on a side wall of the second film; and etching the first film by a second etching gas generating a controlled amount of an etchant sufficient for effecting etching for the first film with avoiding corrosion of the second film.

In the preferred process, the first etching gas is consisted of $Cl_2/BCl_3/N_2/CHF_3$. On the other hand, the second etching gas may be consisted of $BCl_3$. In the alternative, the second gas may be added an additive gas of $N_2$ and $CHF_3$.

In the preferred process, etching of the second and third films may be performed under a condition of gas flow rates of $Cl_2/BCl_3/N_2/CHF_3$=20 sccm/40 sccm/5 sccm/5 sccm, a pressure of 25 Pa, RF power of 650 W. Also, etching of the first film may be performed under a condition of gas flow rates of $Cl_2/BCl_3/N_2/CHF_3$=5 sccm/40 sccm/5 sccm/5 sccm, a pressure of 25 Pa, RF power of 450 W. In the alternative, etching of the first film may be performed under a condition of gas flow rates of $CHCl/N_2/CHF_3$=40 sccm/5 sccm/5 sccm, a pressure of 25 Pa, RF power of 450 W.

BRIEF DESCRIPTION OF THE DRAWINGS

The present invention will be understood more fully from the detailed description given herebelow and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscure the present invention.

(First Embodiment) FIGS. 1(A) to 1(E) are sections showing process steps of the preferred embodiment of an etching method according to the present invention in a sequential order. The etching method according to the present invention will be discussed in terms of application for wiring of AlCu/TiN.

Figure 1A:
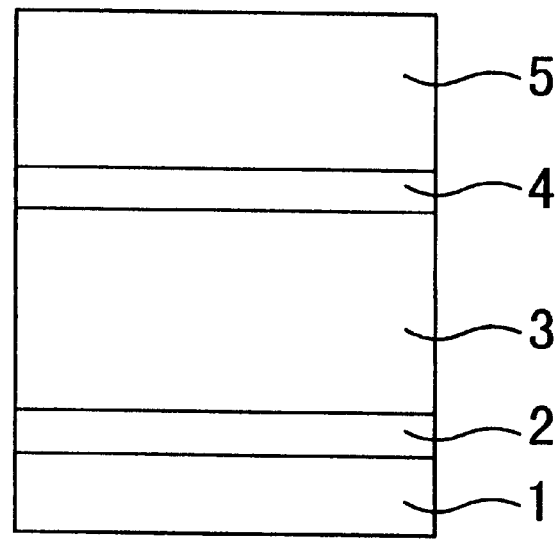
FIGS. 1(A) to 1(E) are sections showing process steps of the preferred embodiment of an etching method according to the present invention in a sequential order.

At first, as shown in FIG. 1(A), on a $SiO_2$ film 2 as an interlayer insulation film, a TiN film 2, an AlCu film 3 and a TiN film 4 are formed in sequential order. On the TiN film 4, an $SiO_2$ film 5 is deposited.

Figure 1B:
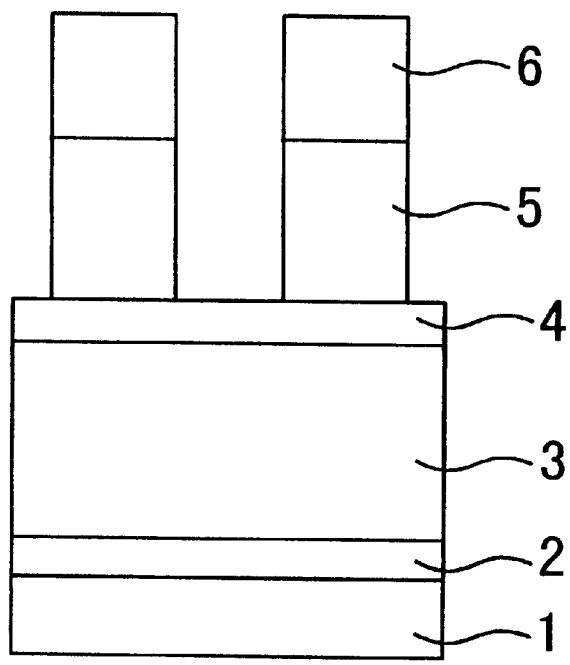

Then, as shown in FIG. 1(B), a resist film 6 is formed over the $SiO_2$ film 5. The resist film 6 is then patterned. With taking the patterned resist film 6, etching is performed for the $SiO_2$ film 5.

Figure 1C:
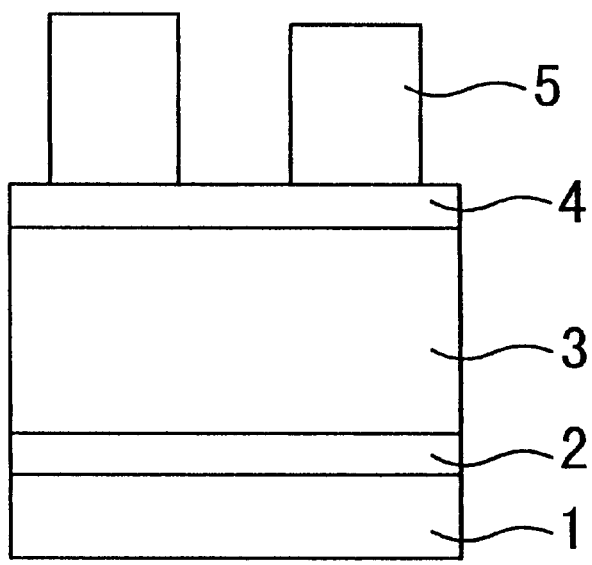

Subsequently, as shown in FIG. 1(C), the resist film 6 is removed. Here, with taking the $SiO_2$ film 5 as the mask, formation of wiring is performed using the present invention.

Figure 1D:
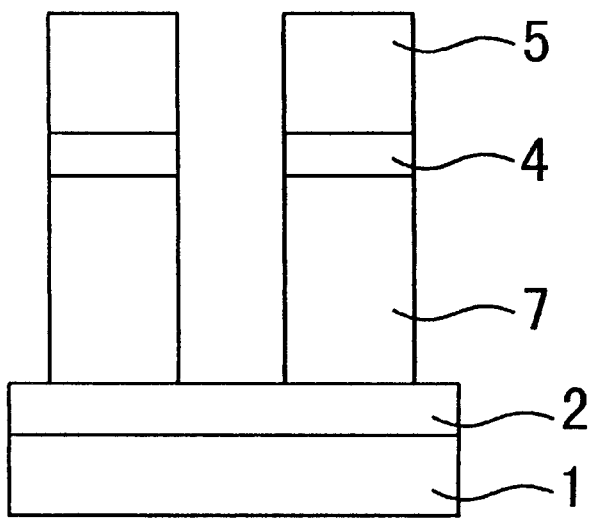
Figure 1E:
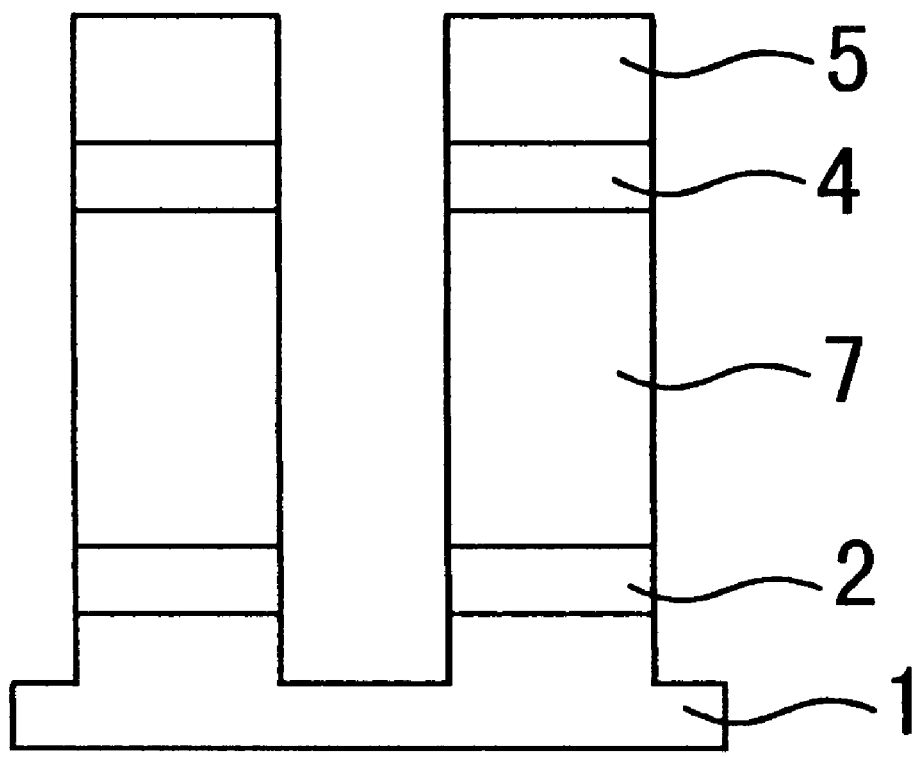
Figure 2A:
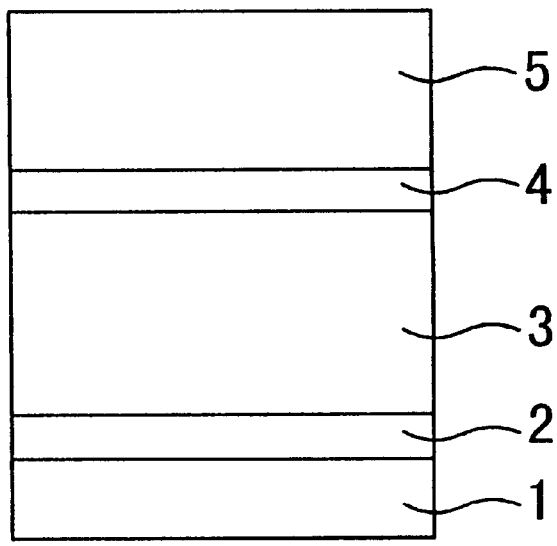
FIGS. 2(A) to 2(E) are sections showing process steps of the conventional etching method in a sequential order.
Figure 2B:
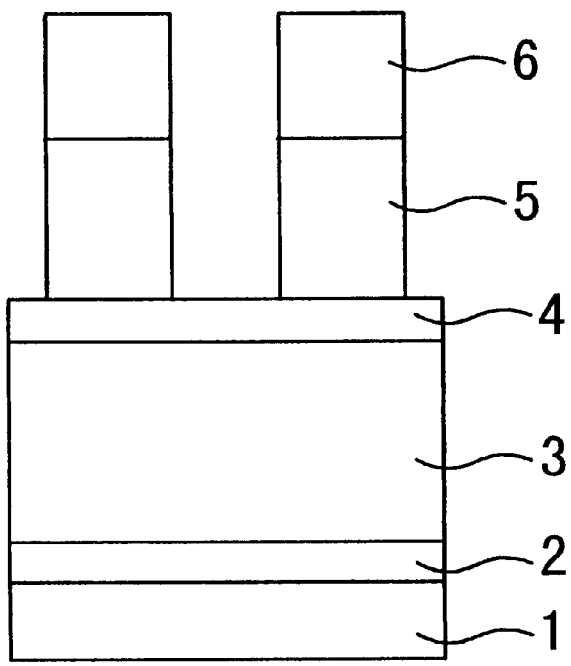
Figure 2C:
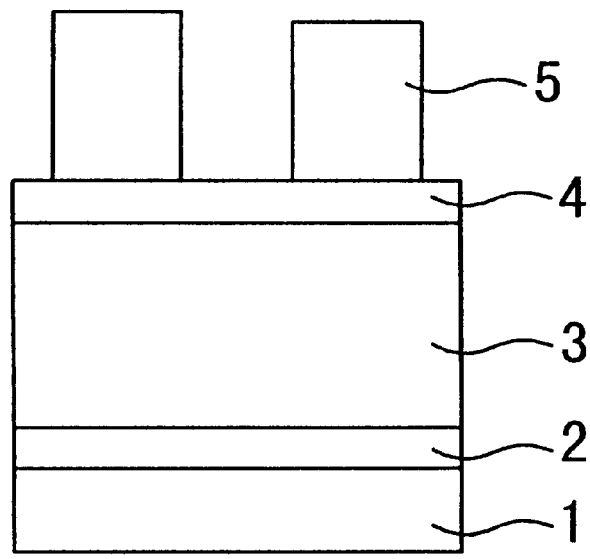
Figure 2D:
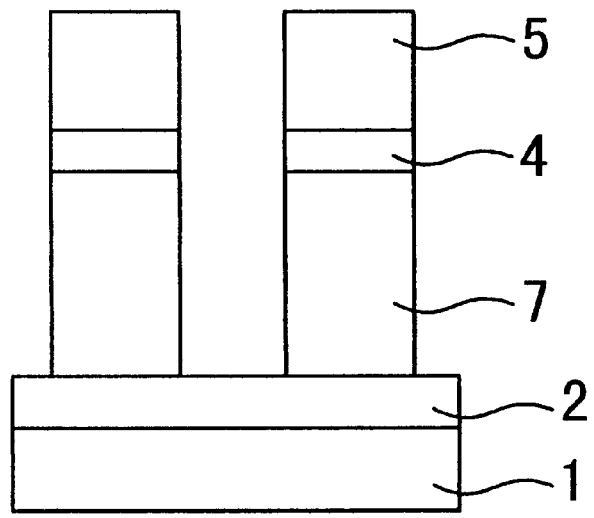
Figure 2E:
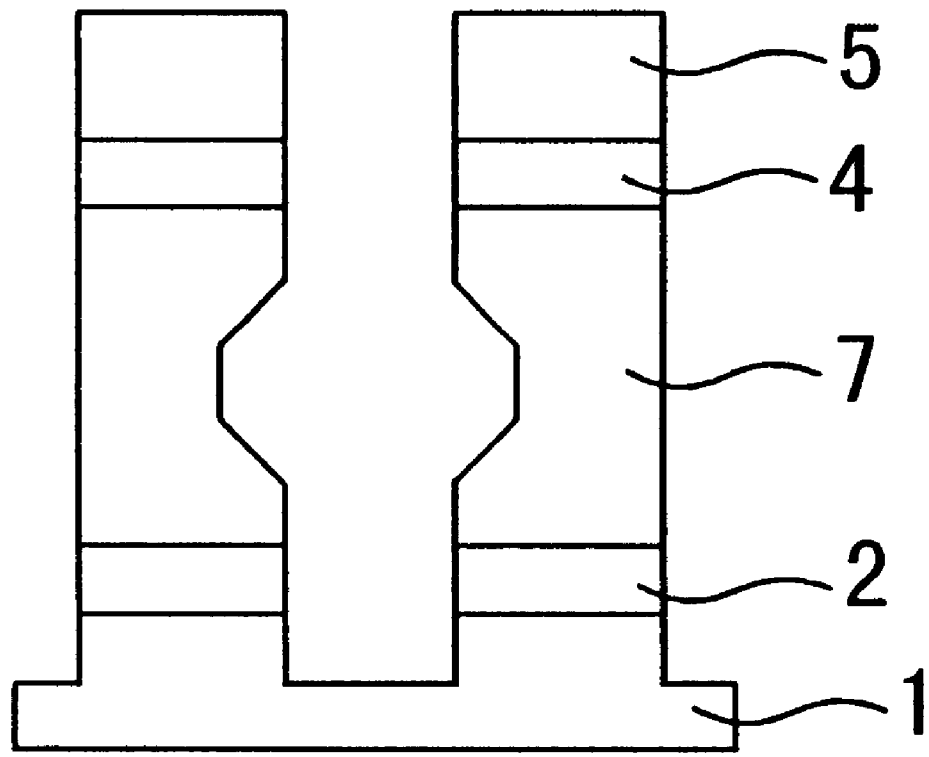

Discussing particularly, as shown in FIG. 1(D), at first, at the first step, etching of the AlCu film 3 is performed with taking the $SiO_2$ film 5 as the mask. Here, similarly to the conventional etching method, etching is performed using $Cl_2/BCl_3/N_2/CHF_3$. For example, using a condition of gas flow rates of $Cl_2/BCl_3/N_2/CHF_3$=20 sccm/40 sccm/5 sccm/5 sccm, a pressure of 25 Pa, RF power of 650 W, etching of the AlCu film 3 is performed with forming a side wall protection film by supplying an N type deposition material to the side wall of the AlCu film 3 to form an electrode wiring 7 (FIG. 1(D)).

Next, as the second step, etching of the TiN film 2 is performed using the present invention. The shown embodiment of the present invention features in use of a compound gas containing chlorine atom, without using $Cl_2$ in the etching gas. In the shown embodiment of the present invention, etching is performed with taking $BCl_3$ as an etching gas and $N_2$ and $CHF_3$ as additive gas.

In the prior art, in etching of the TiN film, a mixture gas containing $Cl_2$ gas has been used in order to use Cl radical as main etchant. However, as a result of study, it has been found that, without using $Cl_2$ gas, even with a compound gas containing Cl atom, such as $BCl_3$, TiN can be sufficiently etched.

The reason is considered that Cl radical as etchant can be sufficiently generated and supplied from $BCl_3$. Also, since $Cl_2$ has high degree of dissociation, excessive Cl radical can be generated to be a cause of corrosion of the AlCu film 3. In contrast to this, it has been found that, in case of $BCl_3$, generation of Cl radical can be controlled so as not to generate excessive Cl radical. As an actual etching condition, using a condition of gas flow rates of $Cl_2/BCl_3/N_2/CHF_3$=5 sccm/40 sccm/5 sccm/5 sccm, a pressure of 25 Pa, RF power of 450 W, etching and overetching of the TiN layer 2 is performed without causing corrosion of AlCu film 3 to complete the electrode wiring 7 consisted of AlCu film 3.

(Second Embodiment) Next, a case where the etching method according to the present invention is applied to a wiring of AlCu/TiN, will be discussed as the second embodiment.

In the second embodiment of the present invention, a structure shown in FIG. 1(D) can be obtained in the similar process to those in the first embodiment. Subsequently, etching of the TiN film is performed.

In the second embodiment, in place of $BCl_3$ using the first embodiment, etching is performed using a gas type, such as $HCl/N_2/CHF_3$, using $CHCl_3$ or HCl. As an etching condition, using a condition of gas flow rates of $CHCl/N_2/CHF_3$=40 sccm/5 sccm/5 sccm, a pressure of 25 Pa, RF power of 450 W, etching and overetching of the TiN layer 2 is performed without causing corrosion of AlCu film 3 to complete the electrode wiring 7.

As set forth above, according to the present invention, by using a mixture gas of a compound gas containing chlorine atom and an additive gas and not using $Cl_2$ for performing etching of the TiN film, generation of Cl radical can be restricted. By this, when the oxide film (resist) is used as the mask, reaction amount of AlCu film and Cl radical can be restricted even when the carbon type deposition material is not supplied from the resist so that etching of the TiN film can be performed with Cl radical generated from the compound gas containing chlorine atom ($BCl_3$ and the like) with improving corrosion resistance of the AlCu film. Therefore, it becomes possible to provide an effective means for performing etching of the stacked film of AlCu film/TiN film with taking the oxide film mask, as required associating with future down-sizing.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. An etching method for etching a stacked film having a first film and a second film of AlCu film/TiN film and having an oxide film as a mask, comprising the steps of:

etching the first film of said stacked film with a first etching gas including $Cl_2$; and etching the second film of said stacked film; wherein a gas for etching said second film, is a compound gas containing a chlorine atom, and includes a mixture gas of the etching gas and an additive gas and does not include a $Cl_2$, a corrosion resistance of AlCu film against the etching gas can be improved.

2. An etching method as set forth in claim 1, wherein $BCl_3$ is used as said etching gas and $N_2$ and $CHF_3$ are used as said additive gas.

3. An etching method as set forth in claim 1, wherein $CHCl_3$ or HCl is used as the etching gas.

4. A method for forming a stacked film electrode wiring in a semiconductor device comprising the steps of:

forming a first film formed with a first alloy;

depositing a second film of a second alloy over said first alloy film;

depositing a third film of said first alloy over said second film;

depositing an oxide film over said third film;

depositing a resist film over said oxide film;

patterning said resist film;

etching said oxide film with taking the patterned resist film;

etching said second and third films with removing said resist film and taking said oxide film as a mask by a first etching gas containing a source of a material of a side wall protection film to be deposited on a side wall of said second film and $Cl_2$; and etching said first film by a second etching gas not including $Cl_2$ generating a controlled amount of an etchant sufficient for effecting etching for said first film with avoiding corrosion of said second film.

5. A method for forming a stacked film electrode wiring in a semiconductor device comprising the steps of:

forming a first film formed with a first alloy serving as an insulation film, on a semiconductor substrate;

depositing a second film of a second alloy over said first alloy film, said second alloy forming said electrode wiring;

depositing a third film of said first alloy over said second film;

depositing an oxide film over said third film;

depositing a resist film over said oxide film;

patterning said resist film;

etching said oxide film with taking the patterned resist film;

etching said second and third films with removing said resist film and taking said oxide film as a mask by a first etching gas containing a source of a material of a side wall protection film to be deposited on a side wall of said second film and $Cl_2$; and etching said first film by a second etching gas not including $Cl_2$ generating a controlled amount of an etchant sufficient for effecting etching for said first film with avoiding corrosion of said second film.

6. A method for forming a stacked film electrode wiring in a semiconductor device comprising the steps of:

forming a first film formed with TiN;

depositing a second film of AlCu over said first alloy film;

depositing a third film of TiN over said second film;

depositing $SiO_2$ film over said third film;

depositing a resist film over said oxide film;

patterning said resist film;

etching said $SiO_2$ film with taking the patterned resist film;

etching said second and third films with removing said resist film and taking said $SiO_2$ film as a mask by a first etching gas containing a source of a material of a side wall protection film to be deposited on a side wall of said second film and $Cl_2$; and etching said first film by a second etching gas not including $Cl_2$ generating a controlled amount of an etchant sufficient for effecting etching for said first film with avoiding corrosion of said second film.

7. A method as set forth in claim 6, wherein said first etching gas consists of $Cl_2/BCl_3/N_2/CHF_3$.

8. A method as set forth in claim 6, wherein said second etching gas is consists of $BCl_3$.

9. A method as set forth in claim 8, wherein said second gas is added an additive gas of $N_2$ and $CHF_3$.

10. A method as set forth in claim 7, wherein etching of said second and third films is performed under a condition of gas flow rates of $Cl_2/BCl_3/N_2/CHF_3$=20 sccm/40 sccm/5 sccm/5 sccm, a pressure of 25 Pa, RF power of 650 W.

11. A method as set forth in claim 9, wherein etching of first film is performed under a condition of gas flow rates of $BCl_3/N_2/CHF$,=40 sccm/5 sccm/5 sccm, a pressure of 25 Pa, RF power of 450 W.

12. A method as set forth in claim 9, wherein etching of said first film is performed under a condition of gas flow rates of $CHCl/N_2/CHF_3$=40 sccm/5 sccm/5 sccm, a pressure of 25 Pa, RF power of 450 W.

* * * * *